United States Patent [19]

Cavasin

[11] Patent Number: 5,476,566
[45] Date of Patent: Dec. 19, 1995

[54] METHOD FOR THINNING A SEMICONDUCTOR WAFER

[75] Inventor: Daniel Cavasin, Austin, Tex.

[73] Assignee: Motorola, Inc., Schaumburg, Ill.

[21] Appl. No.: 187,363

[22] Filed: Jan. 26, 1994

Related U.S. Application Data

[63] Continuation of Ser. No. 940,256, Sep. 2, 1992, abandoned.

[51] Int. Cl.$^6$ ............................ B32B 31/04; B32B 31/22; B32B 31/28
[52] U.S. Cl. ........................ 156/249; 156/154; 156/230; 156/241; 156/275.5; 156/275.7; 156/272.2; 156/344
[58] Field of Search ........................ 156/584, 275.5, 156/275.7, 273.3, 273.9, 153, 154, 307.1, 307.7, 379.6, 230, 344, 247, 249; 428/209, 620; 437/225, 226, 227; 51/131.5

[56] References Cited

U.S. PATENT DOCUMENTS

| | | | |
|---|---|---|---|
| 4,104,099 | 8/1978 | Scherrer | 156/344 X |
| 4,138,304 | 2/1979 | Gantley | 156/268 |
| 4,316,757 | 2/1982 | Walsh | 156/286 |
| 4,466,852 | 8/1984 | Beltz etal. | 156/584 X |
| 4,718,967 | 1/1988 | Irie | 156/344 X |
| 4,720,317 | 1/1988 | Kuroda et al. | 156/275.7 X |
| 4,839,206 | 6/1989 | Waldenberger | 427/209 X |
| 4,891,334 | 1/1990 | Satoh et al. | 437/228 |
| 4,946,716 | 8/1990 | Corrie | 427/289 |
| 5,113,622 | 5/1992 | Nishiguchi et al. | 51/165.73 |
| 5,171,398 | 12/1992 | Miyamoto | 156/552 |
| 5,273,615 | 12/1993 | Asetta et al. | 156/584 |

FOREIGN PATENT DOCUMENTS

| | | | |
|---|---|---|---|
| 0170538 | 10/1982 | Japan | 156/154 |
| 0157508 | 10/1985 | Japan | 437/226 |

OTHER PUBLICATIONS

William C. Howell, "The Direct Demount of Thinned GaAs Wafers to Sawing Tape", Conference on Gallium Arsenide Manufact. Tech. (MANTECH 1990) pp. 48–51.
Richard L. Lane, "Silicon Wafer Preparation," Handbook of Semiconductor Silicon Technology, 1990, pp. 192–257.

Primary Examiner—David A. Simmons
Assistant Examiner—M. Curtis Mayes
Attorney, Agent, or Firm—Minh-Hien N. Clark

[57] ABSTRACT

Advances in wafer technology and packaging have led to an increase in wafer size while requiring a decrease in wafer thickness. Thickness limitations increase as wafer diameter increases. Thinning a wafer past a certain limit can result in wafer breakage. A laminated semiconductor wafer structure (10) is assembled to provide mechanical support for the wafer. A semiconductor wafer (12) is affixed to a UV transparent support substrate (16) with a double-sided adhesive tape (14). The tape has dissimilar adhesives on its two sides. The first side has a UV curable adhesive (22) that adheres to the active surface of the wafer. The second side has a non-UV curable adhesive (24) which adheres to the UV transparent support substrate. This laminated structure can be used during a wafer thinning process and any subsequent handling. The support substrate and the tape are removed from the wafer by exposing the laminated structure to UV radiation.

15 Claims, 2 Drawing Sheets

METHOD FOR THINNING A SEMICONDUCTOR WAFER

This application is a continuation of prior application Ser. No. 07/940,256, filed Sep. 2, 1992 now abandoned.

FIELD OF THE INVENTION

The present invention relates to protecting a semiconductor wafer in a thinning process in general, and more specifically to using a laminated semiconductor wafer structure in the wafer thinning process.

Background of the Invention

Semiconductor wafers are typically sawn to approximately a 30 mil (0.79 millimeter) thickness as they are being manufactured. Wafers can be thinned in subsequent processing by a backgrind or backlap process where the backside or inactive side of the wafer is ground or polished until the wafer is of a desired thickness. A typical range for a backlapped wafer thickness is between 14 mils (0.36 millimeter) and 17 mils (0.43 millimeter). In many instances, backgrinding of wafers is not necessary if the packaging for the semiconductor dice on the wafer is thick.

In the current wafer backgrind process, either an adhesive tape or a spin-on photoresist is applied to the active or patterned surface of the wafer to protect the circuitry. The backside of the wafer is then ground until the wafer is of the desired thickness. In the case of the adhesive tape, the tape is essentially peeled off the wafer's active surface after backgrinding. The tape removal occurs before the wafer is subsequently mounted to dicing tape for wafer sawing. The wafer is subjected to a great amount of bending stress during the tape removal process. In the case of the spin-on photoresist, the material is washed off the wafer's active surface with a solvent. However, using a photoresist mask to protect the patterned wafer surface during backgrinding is an antiquated process. Moreover, residue may remain on the active surface of the wafer even after a solvent cleaning. Nevertheless, the current backgrind process has been successful in production despite its disadvantages because wafers have generally remained thick enough to withstand handling.

Advances in device packaging, however, have led to thinner packages, with a lowest possible package profile being a goal. Therefore, very thin wafers have become a requirement for the new type of package configurations, such as the thin small outline package (TSOP) and the tape carrier package (TCP). TSOPs are approximately 1 millimeter thick, while TCPs are approximately 0.5 millimeter thick. With such thin package bodies, the semiconductor dice housed inside those packages must be as thin as possible. The semiconductor wafers have to be backlapped to a 7 mil to 8 mil (0.18 millimeter to 0.20 millimeter) thickness.

In addition, advances in wafer technology have led to an increase in wafer size. Until recently, wafers have typically been 6 inches (152 millimeters) in diameter or less, but the industry is now starting to produce 8 inch (203 millimeters) diameter wafers. As wafer diameter increases, thickness limitations increase as well, such that 11 mils (0.28 millimeters) is the practical thickness limit for 8 inch diameter (203 millimeters) wafers. Thinning material past this limit results in unacceptable yield loss due to wafer breakage during subsequent handling, due to the brittle nature of silicon and gallium arsenide. Over 90% yield loss occurs for 8 inch (203 millimeters) wafers ground to an 8 mil (0.20 millimeter) thickness. The majority of this breakage occurs during transfer between process points and during the mounting of the thinned wafer onto film frames for dicing.

A major disadvantage to the current backgrind process, whether it involves the use of the adhesive tape or the spin-on photoresist, is that neither method provides mechanical support for very thin wafers either during the backgrind process or in subsequent handling and processing. The tape does, however, provide some cushioning during the backgrind process, but offers no mechanical support afterward for wafer handling because the tape is removed from the wafer after the backgrind process. As stated previously, the majority of wafer breakage occurs during transfer between process points and during the mounting of the thinned wafer onto film frames for dicing. The breakage occurs largely as a result of the wafers not being mechanically supported by any structure between the steps of backgrinding and mounting to a dicing film frame. It is desirable to minimize losses due to wafer fracturing as a result of being extremely thin because the cost to produce an 8 inch (203 millimeters) semiconductor wafer is very high.

SUMMARY OF THE INVENTION

There is provided, in accordance with the invention, a method for assembling a laminated semiconductor wafer structure which can be used in a wafer thinning process to provide mechanical support for the wafer. A semiconductor wafer is provided having an active surface and an inactive surface. The wafer is affixed to a UV transparent support substrate with a double-sided adhesive tape. The double-sided adhesive tape has dissimilar adhesives on its two sides. The first side of the tape has a UV curable adhesive which is applied to the active surface of the semiconductor wafer. The second side of the tape has a non-UV curable adhesive which is applied to the UV transparent support substrate, thus forming a laminated semiconductor wafer structure composed of a semiconductor wafer, a double-sided adhesive tape, and a UV transparent support substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
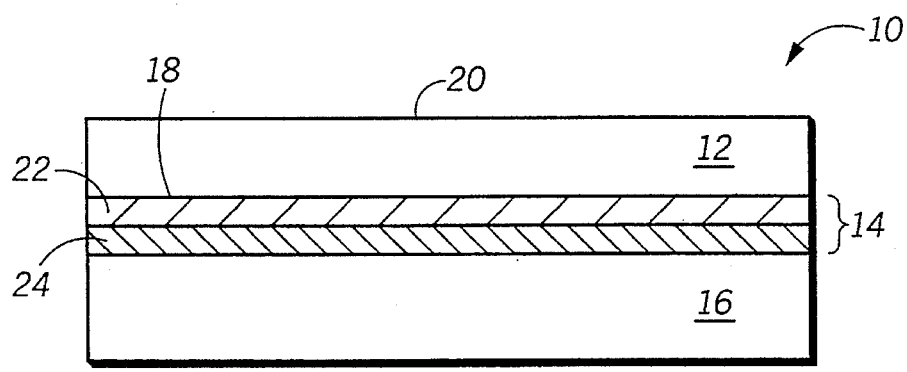
FIG. 1 illustrates, in cross-section, a laminated semiconductor wafer structure, an embodiment of the invention.

The invention will now be discussed with reference to the figures. Illustrated in FIG. 1 is a cross-sectional view of a laminated semiconductor wafer structure 10 having a semiconductor wafer 12, a double-sided adhesive tape 14, and a UV transparent support substrate 16. Semiconductor wafer 12 has an active surface 18 and an inactive surface 20, where inactive surface 20 is exposed. Semiconductor wafers are generally made from silicon, although gallium arsenide can also be used. Both materials are brittle in nature and can fracture easily if stressed, especially if the semiconductor wafer is very thin as compared to its diameter. It is envisioned that the present invention is necessary if the wafer diameter is 8 inches (203 millimeters) or larger. However, it is possible to use the laminated semiconductor wafer structure 10 with a wafer of any size. Even 5 inch (127 millimeters) wafers may need mechanical support during backgrinding and subsequent handling if the wafer thickness falls below 7 mils (0.18 millimeter).

As illustrated in FIG. 1, double-sided adhesive tape 14 has dissimilar adhesives on the two sides. The first side has a UV curable adhesive 22 that adheres to the active surface 18 of semiconductor wafer 12. The second side has a non-UV curable adhesive 24 that adheres to the UV transparent support substrate 16. The non-UV curable adhesive should have a low UV absorption coefficient, meaning that it should transmit more UV radiation than it absorbs. Both kinds of adhesives are commercially available.

As further illustrated in FIG. 1, the UV transparent support substrate 16 should be at least as large in diameter as the semiconductor wafer 12 that substrate 16 supports, although support substrate 16 can be larger than the wafer. The UV transparent support substrate 16 is made from a material that readily transmits UV radiation without losing its integrity, for example, glass, polycarbonate, or polyvinyl chloride. Other polymers can also be used as long as the polymer is sufficiently rigid to provide mechanical support to the semiconductor wafer. Depending on the stiffness of the material used for support substrate 16, the substrate 16 can range in thicknesses from 20 mils to 700 mils (0.5 millimeter to 18 millimeters).

A major advantage to assembling the laminated semiconductor wafer structure 10 is that support substrate 16 provides mechanical support for the semiconductor wafer 12 during any backside 20 processing, such as backgrinding, and any subsequent handling. The prior art does not teach providing mechanical support for thinned wafers after the step of backgrinding, whereas the present invention provides mechanical support during backgrinding as well as any subsequent handling until the thinned wafer is safely transferred to another supporting structure, thus mitigating the potential for wafer breakage. The UV curable adhesive 22 loses its tackiness upon exposure to UV radiation, thus enabling the semiconductor wafer 12 to be removed from the double-sided adhesive tape 14 and support substrate 16 without having potentially damaging bending stresses exerted on the wafer 12.

Figure 2:
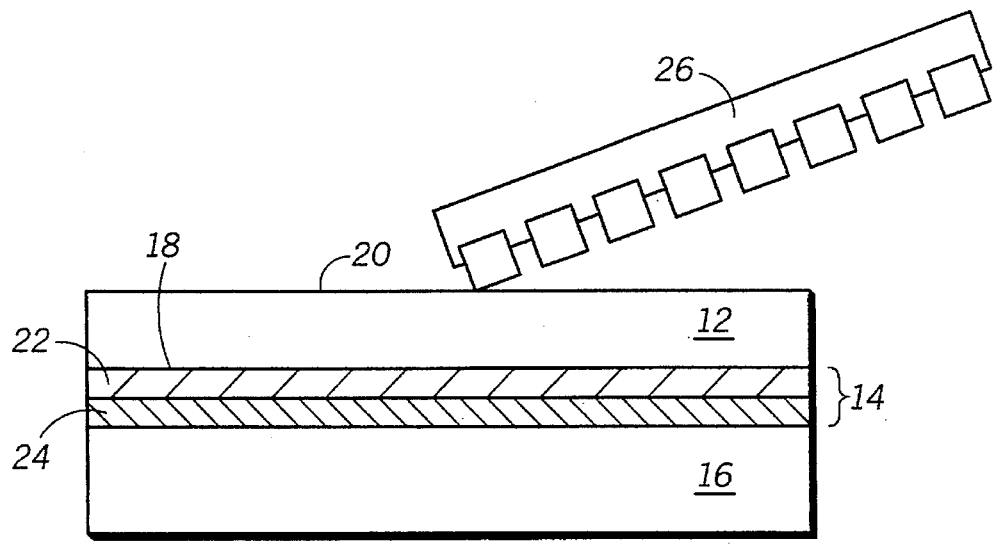
FIGS. 2–6 illustrate, in cross-section, process steps for using the structure of FIG. 1 in a wafer backgrind process, in an application of an embodiment of the invention.

FIGS. 2–6 illustrate process steps for using the laminated semiconductor wafer structure 10 of FIG. 1 in a wafer backgrind or backlap process, an application use of an embodiment of the invention. After a semiconductor wafer 12 has been processed such that it has an active surface 18 and an inactive surface 20 and is ready to be thinned, wafer 12 is mounted onto UV transparent support substrate 16 using the double-sided adhesive tape 14, according to the above discussion of FIG. 1. The laminated semiconductor wafer structure 10 is then processed through a normal backgrind or backlap process to thin the wafer to a desired thickness. Structure 26, as illustrated in FIG. 2, is only intended to represent a generic wafer backgrinding tool. Actual semiconductor wafer backgrinding equipment may look substantially different from the illustration, but the scope of the invention does not extend to the actual wafer backgrind process.

Figure 3:
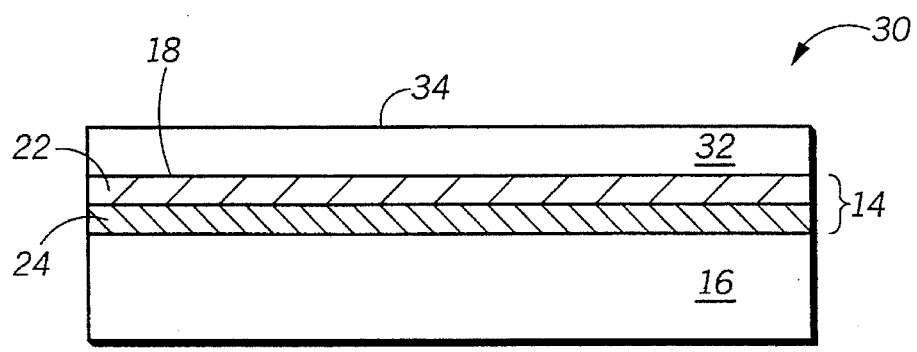

Illustrated in FIG. 3 is a laminated backlapped semiconductor wafer structure 30, after the wafer backgrinding step of FIG. 2. Semiconductor wafer 32 is a thinned wafer having a backlapped surface 34. A typical wafer thickness before backgrinding is approximately 30 mils (0.76 millimeter). After backgrinding, the thinned wafer can be in a range from 1 mil to 20 mils (0.025 millimeter to 0.50 millimeter) with a typical thickness being 7 mils to 8 mils (0.18 millimeter to 0.20 millimeter). Nevertheless, thinned wafers may be thicker or thinner than the stated range depending on packaging requirements.

Figure 4:
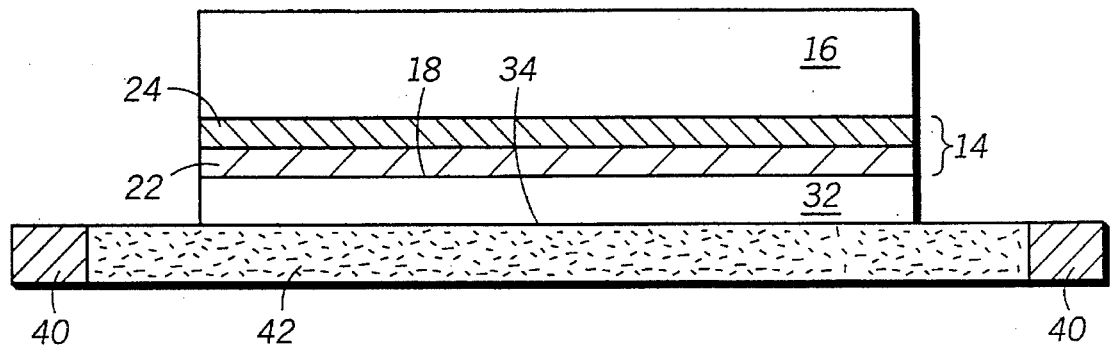

As illustrated in FIG. 4, laminated backlapped semiconductor wafer structure 30 is mounted onto a film frame 40 with dicing tape 42, after the step of backgrinding. Although not specifically illustrated, other steps may follow the backgrinding step before the laminated backlapped semiconductor wafer structure 30 is mounted onto dicing tape 42. For example, the thinned wafer may be cleaned before it is mounted onto dicing tape. The laminated backlapped semiconductor wafer structure 30 may also go through several staging operations before being mounted onto the dicing tape. As illustrated in FIG. 4, the backlapped surface 34 of the thinned semiconductor wafer 32 is mounted to the dicing tape 42. The support substrate 16 provides mechanical support for the thinned wafer 32 as the dicing tape 42 is applied to the backlapped surface 34 with pressure. Without the support substrate 16, very thin wafers with large diameters, such as 8 mils (0.20 millimeter) thick 8 inch (203 millimeters) diameter wafers, can break very easily under stress. The support substrate 16 absorbs the bending stresses being exerted onto the thinned wafer 32.

Figure 5:
Figure 5:
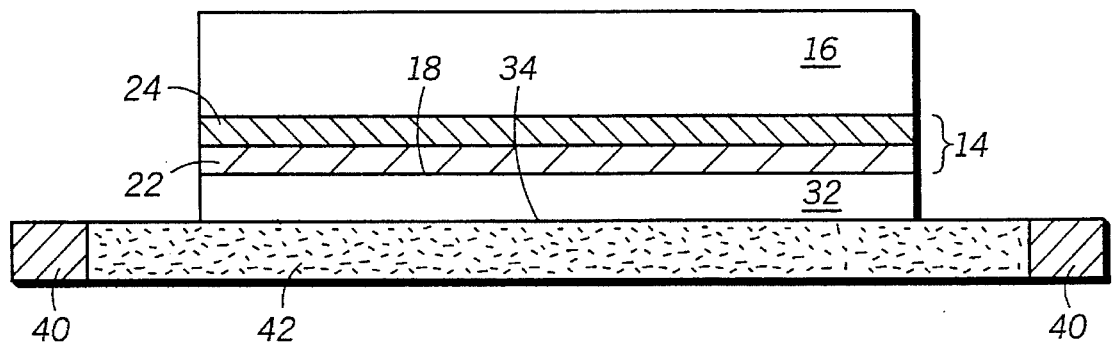

Illustrated in FIG. 5 is a next step in the process flow. The dicing tape mounted laminated backlapped semiconductor wafer structure is irradiated with UV light from a UV source 46. UV source 46 can be a UV lamp or any other suitable source that emits UV radiation. The support substrate 16 is UV transparent and is thus unaffected by the UV radiation. Furthermore, it transmits the UV radiation to the next material, which is the double-sided adhesive tape 14. The non-UV curable adhesive 24 of the double-sided adhesive tape 14 is unaffected by the UV radiation and remains firmly affixed to the support substrate 16. It also transmits the UV radiation to the UV curable adhesive 22. The UV curable adhesive 22 loses its tackiness upon exposure to UV radiation. Therefore, the thinned semiconductor wafer 32 can be removed from the double-sided adhesive tape 14 and support substrate 6, as illustrated in FIG. 6.

Figure 6:
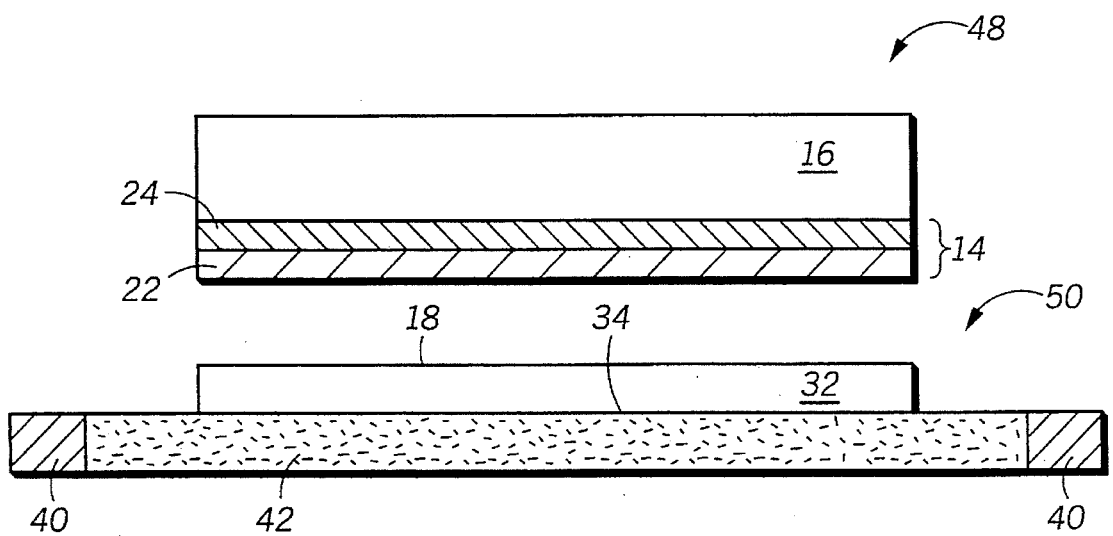

Hence, FIG. 6 illustrates the separation of the thinned wafer 32 from the UV transparent support substrate 16 into two structures. Structure 48 is composed of the support substrate 16 and the double-sided adhesive tape 14. Structure 48 can be reprocessed where the double-sided tape 14 is removed from the support substrate 16 so that the support substrate 16 can be reused. However, it may also be just as cost effective to discard structure 48 after a one time use if the cost of the support substrate 16 is negligible. Structure 50 is composed of the thinned semiconductor wafer 32 mounted onto the dicing tape 42 on film frame 40. The active surface 18 of wafer 32 is exposed once the tape 14 has been removed. The thinned wafer 32 mounted on dicing tape 42 is ready to be diced or sawn. Once a thinned wafer is sawn into individual semiconductor dice, the potential for wafer breakage or damage is eliminated.

The foregoing description and illustrations contained herein demonstrate many of the advantages associated with the present invention. In particular, it has been revealed that by using a laminated semiconductor wafer structure in a wafer thinning process through the point of mounting the wafer on a film frame with dicing tape, the risk for wafer damage during the backgrind process and during subsequent handling is mitigated. The semiconductor wafer is mechanically supported during the wafer thinning process and all subsequent processes and handling. Therefore, the thinned wafer can be of any diameter and thickness. The support substrate is only removed after the thinned wafer has already been mounted onto a dicing tape. Semiconductor wafers are generally sawn or diced immediately after being mounted onto a dicing tape. Furthermore, even if handling of the wafers are necessary after dicing tape mounting, the film frame which supports the dicing tape can be safely handled without directly touching the thinned semiconductor wafer. Thus, the chance for wafer damage is minimal when a laminated semiconductor wafer structure is used.

Thus it is apparent that there has been provided, in accordance with the invention, a laminated semiconductor wafer structure and a method for assembling and using the same in a wafer thinning process that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the UV transparent support substrate can be a lamination of several materials. In addition, the invention is not limited to just silicon and gallium arsenide wafers, but may also be extended to any other type of wafer that needs to be mechanically supported during backside processing. Therefore, it is intended that this invention encompass all such variations and modifications as fall within the scope of the appended claims.

I claim:

1. A method for thinning a semiconductor wafer comprising the steps of:
   providing a semiconductor wafer having an active surface and an inactive surface;
   providing a portable and rigid support substrate, the substrate being a polymer;
   affixing the active surface of the semiconductor wafer to the support substrate using a double-sided adhesive tape, wherein only one side contains a UV curable adhesive, to form a laminated structure;
   backgrinding the inactive surface of the semiconductor wafer to a desired thickness to produce a thinned semiconductor wafer having a backlapped surface, wherein the thinned semiconductor wafer remains laminated to and is supported by the portable and rigid support substrate;
   mounting the backlapped surface of the thinned semiconductor wafer to a dicing tape; and
   removing the portable and rigid support substrate from the thinned semiconductor wafer after the step of mounting by exposing the UV curable adhesive tape to UV radiation, leaving the thinned semiconductor wafer mounted to the dicing tape.

2. The method according to claim 1 wherein the step of affixing the active surface of the semiconductor wafer to the support substrate is further characterized as
   providing the double-sided adhesive tape having a first side with the UV curable adhesive and a second side having a non-UV curable adhesive, wherein the first side of the double-sided adhesive tape is affixed to the active surface of the semiconductor wafer and the second side is affixed to the support substrate.

3. The method according to claim 1 wherein the step of providing the portable and rigid support substrate comprises providing a UV transparent support substrate composed of a material selected from a group consisting of: a polycarbonate and a polyvinyl chloride.

4. The method according to claim 3 further comprising the step of:
   irradiating the dicing tape, the thinned semiconductor wafer, and the portable, rigid and UV transparent support substrate with UV light after the step of mounting such that the UV curable adhesive loses its tackiness to allow easy removal of the thinned semiconductor wafer from the portable, rigid and UV transparent support substrate without requiring solvents.

5. The method according to claim 1 wherein the step of providing the semiconductor wafer comprises providing a wafer having a diameter greater than 125 millimeters.

6. The method according to claim 5 wherein the step of providing the portable and rigid support substrate comprises providing a rigid UV transparent support substrate having a diameter substantially equal to the diameter of the semiconductor wafer.

7. The method according to claim 1 wherein the step of providing the portable and rigid support substrate comprises providing a UV transparent support substrate having a thickness substantially in a range of 1.6 to 18 millimeters.

8. The method according to claim 1 wherein the step of providing the semiconductor wafer comprises providing a wafer composed of a material selected from a group consisting of: silicon and gallium arsenide.

9. A method for thinning a semiconductor wafer comprising the steps of:
   providing a semiconductor wafer having an active surface and an inactive surface;
   providing a double-sided adhesive tape having a first side with a UV curable adhesive and a second side having a non-UV curable adhesive;
   providing a portable and rigid UV transparent support substrate, the substrate being a polymer;
   affixing the first side of the double-sided adhesive tape to the active surface of the semiconductor wafer;
   affixing the second side of the double-sided adhesive tape to the portable and rigid UV transparent support substrate;
   backgrinding the inactive surface of the semiconductor wafer to a desired thickness to produce a thinned semiconductor wafer having a backlapped surface, wherein the thinned semiconductor wafer is supported by the rigid UV transparent support substrate;
   mounting the backlapped surface of the thinned semiconductor wafer to a dicing tape;
   irradiating the dicing tape, the thinned semiconductor wafer, the double-sided adhesive tape, and the rigid UV transparent support substrate with UV light after the step of mounting; and
   removing the rigid UV transparent support substrate and the double-sided adhesive tape from the thinned semiconductor wafer, leaving the thinned semiconductor wafer mounted to the dicing tape.

10. The method according to claim 9 wherein the step of backgrinding comprises producing the thinned wafer having a thickness substantially in a range of 0.17 to 0.35 millimeter.

11. The method according to claim 9 wherein the step of providing the semiconductor wafer comprises providing a wafer composed of a material selected from a group consisting of: silicon and gallium arsenide.

12. The method according to claim 9 wherein the step of providing the portable and rigid UV transparent support substrate comprises providing a substrate composed of a material selected from a group consisting of: a polycarbonate, a polyvinyl chloride, a glass, and a rigid polymer.

13. The method according to claim 9 wherein the step of providing the semiconductor wafer comprises selecting a semiconductor wafer having a diameter greater than 125 millimeters.

14. The method according to claim 13 further comprising providing the portable and rigid UV transparent support substrate having a diameter substantially equal to the diameter of the semiconductor wafer.

15. The method according to claim 9 wherein the step of providing the portable and rigid UV transparent support substrate comprises providing a substrate having a thickness substantially in a range of 1.6 to 18 millimeter.

* * * * *